US009412613B2

(12) United States Patent
Manna et al.

(10) Patent No.: US 9,412,613 B2
(45) Date of Patent: Aug. 9, 2016

(54) DEVELOPMENT OF HIGH ETCH SELECTIVE HARDMASK MATERIAL BY ION IMPLANTATION INTO AMORPHOUS CARBON FILMS

(71) Applicant: Applied Materials, Inc., Santa Clara, CA (US)

(72) Inventors: Pramit Manna, Santa Clara, CA (US); Abhijit Basu Mallick, Fremont, CA (US); Ludovic Godet, Sunnyvale, CA (US); Yongmei Chen, San Jose, CA (US); Jun Xue, San Jose, CA (US); Mukund Srinivasan, Fremont, CA (US); Ellie Y. Yieh, San Jose, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/574,928

(22) Filed: Dec. 18, 2014

(65) Prior Publication Data

US 2015/0194317 A1 Jul. 9, 2015

Related U.S. Application Data

(60) Provisional application No. 61/925,139, filed on Jan. 8, 2014.

(51) Int. Cl.
*H01L 21/308* (2006.01)
*H01L 21/311* (2006.01)
*H01L 21/3115* (2006.01)

(52) U.S. Cl.
CPC ...... *H01L 21/3086* (2013.01); *H01L 21/31144* (2013.01); *H01L 21/31155* (2013.01)

(58) Field of Classification Search
CPC ............ H01L 21/0332; H01L 21/0337; H01L 21/32139; H01L 21/32; H01L 21/31
See application file for complete search history.

(56) References Cited

U.S. PATENT DOCUMENTS

| 6,750,127 | B1 | 6/2004 | Chang et al. |
| 6,989,332 | B1 | 1/2006 | Bell et al. |
| 8,536,034 | B2 | 9/2013 | Flachowsky et al. |
| 2003/0232495 | A1* | 12/2003 | Moghadam et al. .......... 438/623 |
| 2004/0259355 | A1 | 12/2004 | Yin et al. |
| 2005/0042879 | A1 | 2/2005 | Yin et al. |
| 2011/0140064 | A1* | 6/2011 | Bandyopadhyay et al. ...... 257/2 |
| 2011/0287633 | A1 | 11/2011 | Lee et al. |
| 2013/0302996 | A1 | 11/2013 | Reilly et al. |

OTHER PUBLICATIONS

International Search Report and Written Opinion for International Application No. PCT/US2014/071094 dated Mar. 31, 2015.
R.U.A. Khan, et al., Ion-implantation into amorphous hydrogenated carbon films, 276 J. of Non-Crystalline Solids 201 (2000).

(Continued)

*Primary Examiner* — Duy Deo
(74) *Attorney, Agent, or Firm* — Patterson & Sheridan, LLP

(57) ABSTRACT

Embodiments described herein provide for a method of forming an etch selective hardmask. An amorphous carbon hardmask is implanted with various dopants to increase the hardness and density of the hardmask. The ion implantation into the amorphous carbon hardmask also maintains or reduces the internal stress of the hardmask. The etch selective hardmask generally provides for improved patterning in advanced NAND and DRAM devices.

10 Claims, 2 Drawing Sheets

(56) References Cited

OTHER PUBLICATIONS

F. L. Freire Jr. and D.F. Franceschini, Nitrogen Implantation Into Amorphous Carbon Films: SIMS and Positron Annihilation Analyses, 26 Braz. J. of Phys. 353 (1996).

Ming Xu, et al., Mechanical properties of tungsten doped amorphous hydrogenated carbon films prepared by tungsten plasma immersion ion implantation, 203 Surface & Coatings Tech. 2612 (2009).

* cited by examiner

DEVELOPMENT OF HIGH ETCH SELECTIVE HARDMASK MATERIAL BY ION IMPLANTATION INTO AMORPHOUS CARBON FILMS

CROSS-REFERENCE TO RELATED APPLICATIONS

This application claims benefit of U.S. Provisional Patent Application Ser. No. 61/925,139, filed Jan. 8, 2014, which is incorporated herein by reference.

BACKGROUND

1. Field

Embodiments described herein generally relate to methods of forming hardmask materials for semiconductor devices. More specifically, embodiments described herein relate to the development of a high etch selective hardmask material by ion implantation into amorphous carbon films.

2. Description of the Related Art

Hardmasks are used to fabricate NAND and dynamic random access memory (DRAM) devices. Hardmasks are commonly used as sacrificial layers in lithographic patterning and enable, through an etching process, the patterning of features onto a layer of a semiconductor device. The patterned features can form, for example, the transistors and interconnects that allow the NAND and DRAM devices to operate.

The important properties of a hardmask material are etch resistance, compressive stress, mechanical properties, and removability. An ideal hardmask has a high etch resistance compared to the layer to be etch (hereinafter, an "underlayer") so that the underlayer etches in an etch process whereas the hardmask does not. A high etch resistance allows efficient transfer of the pattern of the hard mask to the underlayer. Etch resistance generally shows a positive correlation with hardmask density. An ideal hardmask also has a low compressive stress. A lower compressive stress eliminates undesirable wafer bow after hardmask deposition, which can make further device fabrication difficult. In addition, an ideal hardmask has strong mechanical properties. For example, a high modulus (Young's modulus) or hardness will reduce the line bending of high aspect ratio structures after a mask open step. Finally, an ideal hardmask is easily removed to simplify the fabrication process.

Current hardmasks are insufficient for developing next generation NAND and DRAM devices. As the feature sizes on NAND and DRAM devices decrease, hardmask materials need to exhibit increased etch selectivity and decreased compressive stress properties. However, current attempts at increasing etch selectivity have resulted in an increase in compressive stress, and attempts at decreasing compressive stress have resulted in a decrease in etch selectivity.

Thus, what is needed in the art are methods of forming a hardmask material which exhibits increased etch selectivity while maintaining or reducing the compressive stress of the hardmask material.

SUMMARY

Embodiments described herein provide for a method of forming an etch selective hardmask. An amorphous carbon hardmask is implanted with various dopants to increase the hardness and density of the hardmask. The ion implantation of the amorphous carbon hardmask also maintains or reduces the internal stress of the hardmask. The etch selective hardmask generally provides for improved patterning in advanced NAND and DRAM devices.

In one embodiment, a method of forming an amorphous carbon film is provided. The method comprises depositing an amorphous carbon layer on an underlayer and patterning the amorphous carbon layer. At least a portion of the amorphous carbon layer is etched and a dopant is implanted into the amorphous carbon layer by tilt processing. Finally, the underlayer is etched.

In another embodiment, a method of forming an amorphous carbon layer is provided. The method comprises depositing an amorphous carbon layer on an underlayer and patterning the amorphous carbon layer. At least a portion of the amorphous carbon layer is etched and a dopant is implanted into the amorphous carbon layer. The etching at least a portion of the amorphous carbon layer and the implanting a dopant into the amorphous carbon layer are repeated consecutively until the underlayer is exposed.

In yet another embodiment, a method of forming an amorphous carbon layer is provided. The method comprises depositing a portion of an amorphous carbon layer on an underlayer and implanting a dopant into the deposited portion of the amorphous carbon layer. The depositing a portion of the amorphous carbon layer and the implanting a dopant are repeated consecutively until a desired thickness of the amorphous carbon layer is achieved. The amorphous carbon layer is then patterned and etched.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Ideal hardmask materials should exhibit very high etch resistance when compared to the etching of underlayer materials, such as dielectric stacks. In addition the hardmask materials should also exhibit low stress and strong mechanical properties. Lower stress generally reduces or eliminates undesirable wafer bow after hardmask deposition whereas increased hardness generally reduces undesirable line bending of high aspect ratio structures after the hardmask is opened.

Embodiments described herein provide for a method of forming an etch selective hardmask. An amorphous carbon hardmask is implanted with various dopants to increase the hardness and density of the hardmask. The ion implantation of the amorphous carbon hardmask also maintains or reduces the internal stress of the hardmask. The etch selective hardmask generally provides for improved patterning in advanced NAND and DRAM devices.

FIGS. 1A-1H are schematic, cross-sectional views of a stack 100 illustrating a hardmask formation sequence according to one embodiment. As utilized herein, a stack includes a substrate 102 and one or more layers disposed thereon. The stack 100 includes the substrate 102 and an underlayer 104. The underlayer 104, as utilized herein, an underlayer includes any layer which is disposed beneath an amorphous carbon hardmask 106. For example, the hardmask 106 may be disposed directly above the underlayer 104, such that the hardmask 106 and underlayer 104 are in physical contact with each other.

Figure 1A:
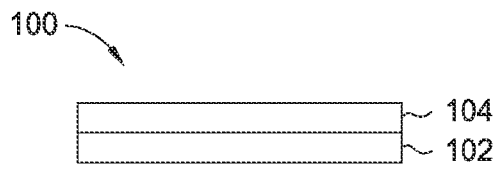
FIGS. 1A-1H are schematic, cross-sectional views of a substrate illustrating a hardmask formation sequence according to one embodiment disclosed herein.

As illustrated in FIG. 1A, the stack includes the substrate 102 and the underlayer 104 disposed over the substrate 102. The underlayer 104 may be, for example, a dielectric layer, such as silicon dioxide or silicon nitride, or a semiconductor material, such as silicon or germanium. The underlayer 104 may be a stack of multiple layers, such as a dielectric stack, or a single layer, such as a single oxide or nitride layer.

Figure 1E:
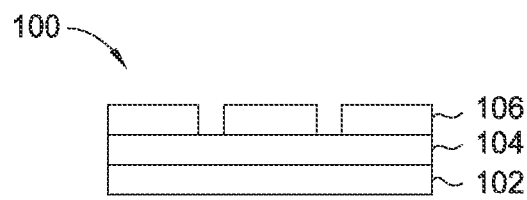
Figure 1B:
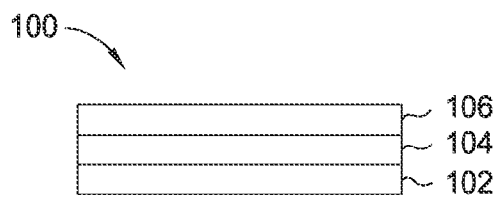

In FIG. 1B, the amorphous carbon hardmask 106 is formed over the underlayer 104. The hardmask 106 may be deposited by various plasma enhanced chemical vapor deposition (PECVD) chambers or systems, such as the CENTURA® ULTIMA HDP-CVD® system, PRODUCER® APF™ PECVD system, or the PRODUCER® TEOS FSG PECVD system, available from Applied Materials, Santa Clara, Calif. In addition to the systems mentioned above, it is contemplated that systems from other manufacturers may also be utilized to deposit the hardmask 106.

The hardmask 106 is deposited by a blanket deposition process over the underlayer 104. The hardmask 106 may be deposited to a thickness which corresponds to the subsequent etching requirements of the underlayer 104. In one example, the hardmask 106 has a thickness of between about 0.5 μm and about 1.5 μm, such as about 1.0 μm.

Figure 1F:
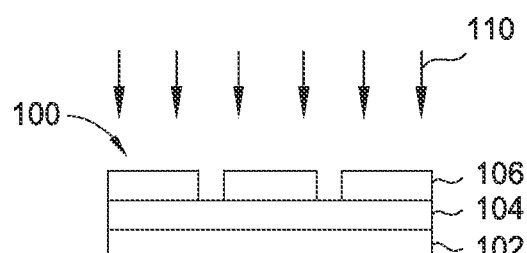
Figure 1C:
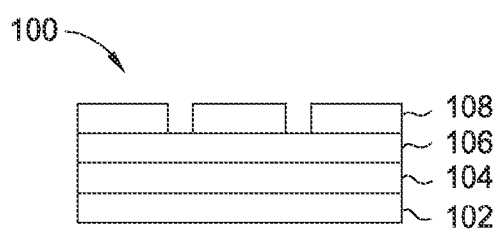

As illustrated in FIG. 1C, a patterned photoresist layer 108 is formed over the hardmask 106. Features or patterns may be transferred to the photoresist 108 from a photomask utilizing an energy source, such as light energy. In one embodiment, the photoresist is a polymeric material and the patterning process is performed by a 193 nm immersion photolithography process, or other similar photolithography process. Similarly, lasers may also be utilized to perform the patterning process.

Figure 1G:
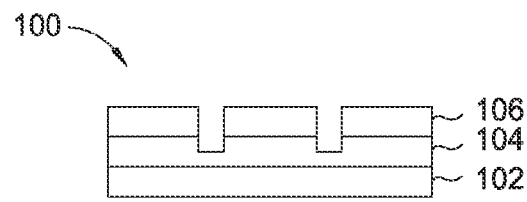
Figure 1D:
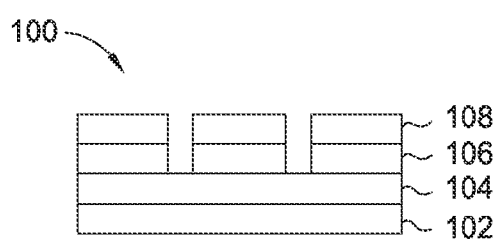

As illustrated in FIG. 1D, the hardmask is opened by, for example, a plasma etching process. The etching process may be performed in a chamber similar to the chambers described with regard to FIG. 1B. In FIG. 1E, the photoresist 108 is removed. The photoresist 108 may be removed by various advantageous photoresist removal processes.

As illustrated in FIG. 1F, an ion implantation process dopes the hardmask 106. In the schematic illustration, implanted ions 110 bombard the hardmask 106 and generally penetrate the hardmask 106. The implanted ions 110 penetrate the hardmask 106 to various depths depending on the type and size of the ions and the power and bias utilized to energize the ions 110. Examples of implanted ions 110 include atomic boron, carbon, silicon, nitrogen, phosphorous, arsenic, aluminum and tungsten. The species of implanted ions 110 may be tailored to provide increased etch selectivity of the underlayer 104. As such, the implanted species may be any monomer or molecular ion which is adapted to enhance etch selectivity of the hardmask 106.

The ion implantation process may be performed by beamline or plasma implantation tools. Exemplary systems utilized to perform the implantation process include, for example, the VARIAN VIISTA TRIDENT system, VIISTA 3000XP system, VIISTA 900XP system, VIISTA HCP system and the VIISTA PLAD system, available from Applied Materials, Inc., Santa Clara, Calif. Although described with regard to the systems mentioned above, it is contemplated that systems from other manufacturers may also be utilized to perform the ion implantation process.

In one embodiment, the ion implantation process implants a dopant, which may be selected from the group consisting of boron, carbon, nitrogen, phosphorous, arsenic, aluminum, and tungsten, into the hardmask 106. The implant energy utilized to energize the dopant is between about 0.5 keV and about 60 keV, depending on the type of dopant utilized, the type of material utilized as the hardmask 106 and the depth of implantation desired. The ion dosage (ions/cm$^2$) is between about $5\times10^{16}$ and about $1\times10^{17}$. For example, when the ion implantation process is performed after the hardmask 106 has been opened and the underlayer 104 is exposed, the ions are implanted with a low or mid energy, such as between about 0.5 keV and about 40 keV, and a high dose, such as greater than about $1\times10^{17}$. The angle of incidence with which the ions are directed towards the hardmask 106 is determined by the aspect ratio of the feature formed in the hardmask 106. For example, tilt processing for implanting the ions at a desired angle is configured to avoid implantation of the underlayer 104.

In general, increased hardness of the hardmask 106 provides for reduced line bending of high aspect ratio structures in the underlayer 104 after the hardmask 106 is opened. It is believed that the implanted ions 110 abstract residual hydrogen atoms from the dangling carbon-hydrogen bonds of the amorphous carbon hardmask 106 and form a carbide structure within the hardmask 106. The carbide structure exhibits increased hardness when compared to an undoped hardmask. Additionally, it is believed the implanted ions 110 occupy interstitial voids present within the amorphous carbon hardmask 106, which results in an increased density of the hardmask 106. The increased density further increases the mechanical integrity of the hardmask 106.

If the implanted ions 110 are heteroatoms, such as boron or aluminum, it is believed that the internal stress of the hardmask 106 is maintained or reduced. In one embodiment, one or more Group III elements are utilized as the implanted ions 110. Conventional in-situ doping generally increases the internal stress of a film which, when deposited as a blanket film, may cause undesirable bowing of the substrate 102. Although reduced internal stress of a film is generally associated with a reduction in etch selectivity, the increased hardness and density of the hardmask 106 function to improve the etch selectivity while the heteroatoms reduce or eliminate the undesirable effects of a low stress film. In combination, the increased hardness and density provide a mechanically robust hardmask 106 which exhibits improved etch selectivity while the internal stress of the hardmask 106 remains constant, or in certain embodiments, is reduced, which eliminated undesirable substrate 102 deformation.

In one embodiment, the ion implantation process is performed once to dope the hardmask 106. In another embodiment, the hardmask 106 etching described in FIG. 1D and the ion implantation process described in FIG. 1F are repeated in a consecutive manner. For example, a portion less than the entire thickness of the hardmask 106 is etched and subsequently bombarded with the ions 110. This process may be repeated as many times as needed until the underlayer 104 is exposed. In this process, the hardmask 106 is doped with implanted ions 110 throughout the entire thickness of the hardmask 106. It is believed that a substantially uniform doping profile throughout the thickness of the hardmask 106 may further increase the etch selectivity of the hardmask 106.

In the embodiments where the etching and ion implantation are repeated, a low energy, such as between about 0.5 keV and about 20 keV, and a medium dose, such as about $1\times10^{17}$, are utilized to dope the hardmask 106.

Optionally, the repeated etching and ion implantation processes described may be employed on various other materials. The other materials may include hardmasks for patterning or may be any material advantageously utilized in forming semiconductor devices, optoelectronics, light emitting diode devices, solar devices and medical devices. For example, aspects of the repeated etching and ion implantation may be employed to form a material incorporating a desired impurity profile throughout the material. In one example, a material, such as polysilicon or other similar materials, is subjected to multiple etching and ion implantation processes to form desirable films for use, for example, in forming p-i-n junctions.

In one embodiment, subsequent to the ion implantation process, the stack 100 is thermally treated. Suitable post-ion implant thermal treatment techniques include UV treatment, thermal annealing, and laser annealing. The thermal treatment of the doped hardmask 106 further incorporates the implanted ions 110 into the framework of the hardmask 106. For example, the implanted ions 110 may be redistributed within the hardmask 106 for form a more uniform doping profile. It is believe the thermal treatment may increase interaction and bonding between the amorphous carbon of the hardmask 106 and the implanted ions 110. The redistribution and bonding of the implanted ions 110 may function to further increase the hardness, density, and etch selectivity of the hardmask 106.

As illustrated in FIG. 1G, the underlayer 104 is etched. The underlayer 104 etching may be performed in a plasma processing chamber, such as the chambers and systems described with regard to FIG. 1B. Etchants, such as fluorocarbons, remove the exposed portions of the underlayer. The active species of the etchants are substantially unreactive with the materials, the implanted ions 110, of the hardmask 106. Thus, the etchants are selective for the underlayer 104 material. Suitable examples of etchants include, $CF_4$, $CHF_3$, HBr, $BCl_3$, and $Cl_2$ among others. The etchants may be provided to with an inert carrier gas.

Figure 1H:
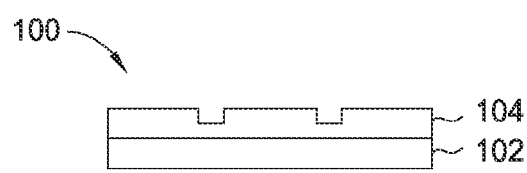

As illustrated in FIG. 1H, the hardmask 106 is removed. The hardmask 106 may be removed by advantageous hardmask removal processes. In one example, an oxygen plasma is utilized to remove the hardmask 106. The resulting stack 100 includes the underlayer 104 having a feature, such as a high aspect ratio feature, formed therein. The stack 100 may then be subjected to further processing to form a functional semiconductor device.

Figure 2A:
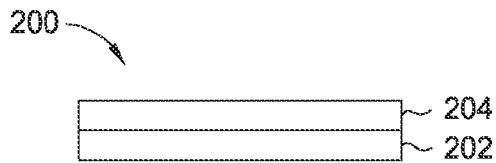
FIGS. 2A-2H are schematic, cross-sectional views of a substrate illustrating a hardmask formation sequence according to one embodiment disclosed herein.
Figure 2E:
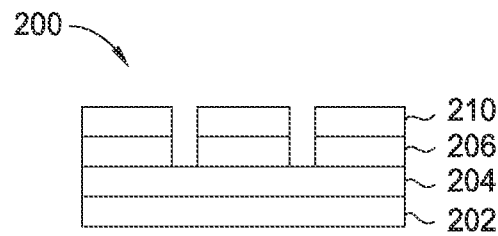
Figure 2B:
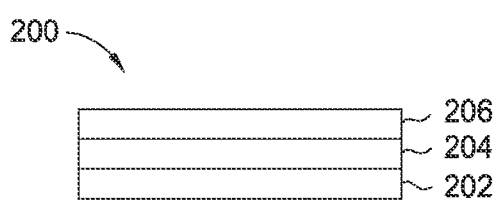
Figure 2F:
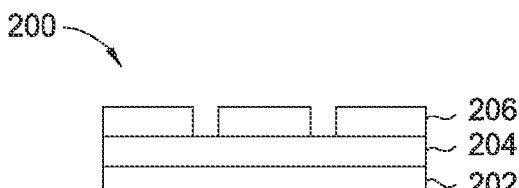
Figure 2C:
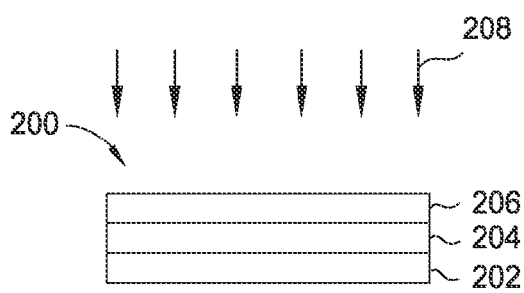

FIGS. 2A-2H are schematic, cross-sectional views of a stack 200 illustrating a hardmask formation sequence according to one embodiment. FIGS. 2A-2B are similar to FIGS. 1A-1B and will not be described for the sake of brevity. As such, the stack 200 includes a substrate 202 and an underlayer 204 disposed over the substrate 202. FIG. 2C illustrates the ion implantation process whereby a hardmask 206 is doped with implanted ions 208. The ion implantation process is described in greater detail with regard to FIG. 1F.

In one embodiment, the entire hardmask 206 is deposited over the underlayer 204 and subsequently doped with the implanted ions 208. Depending on various processing parameters, it may be possible to obtain a substantially uniform doping profile utilizing a single ion implantation process subsequent to the hardmask 206 deposition. In another embodiment, a portion less than the entire thickness of the hardmask 206 is deposited over the underlayer and that portion of the hardmask 206 is subjected to the ion implantation process. The hardmask 206 deposition and ion implantation process is repeated in a consecutive manner until a desired thickness of the hardmask 206 is achieved. The final thickness of the deposited hardmask 206 may be between about 0.5 µm and about 1.5 µm, such as about 1.0 µm. It is believed that a substantially uniform doping profile throughout the thickness of the hardmask 206 increases the etch selectivity of the hardmask 206.

In the embodiment where the hardmask 206 is blanket deposited and doped a single time, the implant energy is high, such as between about 40 keV and about 60 keV, and the dose is also high, such as greater than about $1\times10^{17}$. In this embodiment, the ions have a substantially normal incidence to the hardmask 206. In the embodiment where the hardmask 206 deposition and ion implantation process are repeated, a low energy, such as between about 0.5 keV and about 20 keV, and a medium dose, such as about $1\times10^{17}$, are utilized to dope the hardmask 206. Similar to the hardmask 206 blanket deposition and single ion implantation embodiment, the ions are provided with a substantially normal incidence to the hardmask 206 in the repeated deposition and ion implantation embodiment.

Optionally, the repeated deposition and ion implantation processes described may be employed on various other materials. The other materials may include hardmasks for patterning or may be any material advantageously utilized in forming semiconductor devices, optoelectronics, light emitting diode devices, solar devices and medical devices. For example, aspects of the repeated deposition and ion implantation may be employed to form a material incorporating a desired impurity profile throughout the material. In one example, a material, such as polysilicon or other similar materials, is subjected to multiple deposition and ion implantation processes to form desirable films for use, for example, in forming p-i-n junctions.

Figure 2G:
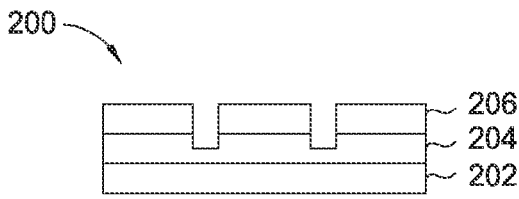
Figure 2D:
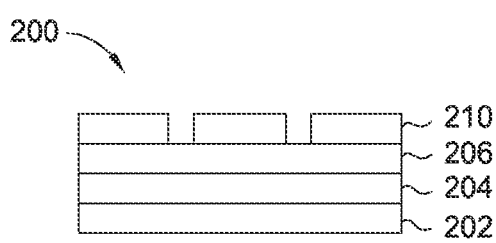

FIGS. 2D-2F are similar to FIGS. 1C-1E. As illustrated in FIG. 2D, a patterned photoresist 210 is formed over the hardmask 206 and light energy may be utilized to transfer a pattern to the hardmask 206. In FIG. 2E, the hardmask 206 is etched to expose the underlayer 204. In FIG. 2F, the photoresist 210 is removed.

In one embodiment, subsequent to the ion implantation process, the stack 200 is thermally treated. The stack 200 may be annealed after any of the processes illustrated in FIGS. 2C-2F. Suitable post-ion implant thermal treatment techniques include UV treatment, thermal annealing, and laser annealing. The thermal treatment of the doped hardmask 206 further incorporates the implanted ions 208 into the framework of the hardmask 206. For example, the implanted ions 208 may be redistributed within the hardmask 206 for form a more uniform doping profile. It is believe the thermal treatment may increase interaction and bonding between the amorphous carbon of the hardmask 206 and the implanted ions 208. The redistribution and bonding of the implanted ions 208 may function to further increase the hardness, density, and etch selectivity of the hardmask 206.

Figure 2H:
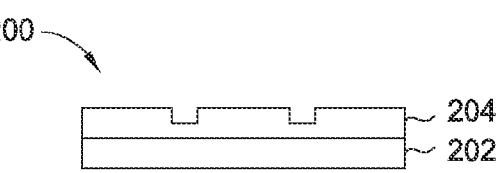

FIGS. 2G-2H are similar to FIGS. 1G-1H. As illustrated in FIG. 2G, the underlayer 204 is etched to form a feature, such as a high aspect ratio feature. In FIG. 2H, the hardmask 206 is removed which results in the stack 200 having one or more features formed in the underlayer 204 which is disposed over the substrate 202.

Various methods of forming an amorphous carbon hardmask on an underlayer are provided. The hardmask is patterned with a photoresist and the hardmask is etched to transfer the pattern of the photoresist. Ions are implanted into the hardmask to dope the hardmask. Although not intending to be bound by theory, it is believed that the implanted ions function to increase the mechanical integrity and density of the hardmask while maintaining or reducing the internal stress of the hardmask. The increased mechanical integrity and density of the hardmask reduce line bending after the hardmask is etched and the maintained or reduced stress of the hardmask reduces or eliminates undesirable substrate bowing or deformation. In combination, the etch selectivity of the hardmask is increased.

The ion implantation process may be performed at various times within the hardmask formation sequence. In one embodiment, the ion implantation is performed immediately after the hardmask is opened. In this embodiment, the ion implantation process may be performed a single time or may be repeated in consecutive order with the hardmask etching process. In another embodiment, the ion implantation is performed immediately after the hardmask is deposited. In this embodiment, the ion implantation process may be performed a single time or may be repeated in consecutive order with the hardmask deposition process. In certain embodiments, the hardmask is thermally treated prior to etching the underlayer.

While the foregoing is directed to embodiments of the present invention, other and further embodiments of the invention may be devised without departing from the basic scope thereof, and the scope thereof is determined by the claims that follow.

The invention claimed is:

1. A method of forming an amorphous carbon layer, comprising:
    depositing an amorphous carbon layer on an underlayer;
    patterning the amorphous carbon layer;
    etching at least a portion of the amorphous carbon layer to expose a portion of the underlayer;
    implanting a dopant into the amorphous carbon layer by tilt processing, wherein the tilt processing implants the dopant at a predetermined angle to avoid implantation of the portion of the underlayer that is exposed; and
    etching the underlayer.

2. The method of claim 1, further comprising annealing the amorphous carbon layer after the implanting a dopant into the amorphous carbon layer.

3. The method of claim 1, wherein a portion of the amorphous carbon layer is deposited and subsequently implanted with the dopant.

4. The method of claim 3, wherein deposition of a portion of the amorphous carbon layer and the dopant implantation are repeated until a desired thickness of the amorphous carbon layer is achieved.

5. The method of claim 1, wherein underlayer comprises a single layer or a dielectric stack.

6. The method of claim 1, wherein the dopant is selected from the group consisting of boron, carbon, nitrogen, phosphorous, arsenic, aluminum, and tungsten.

7. A method of forming an amorphous carbon layer, comprising:
    depositing an amorphous carbon layer on an underlayer;
    annealing the amorphous carbon layer after a desired thickness of the amorphous carbon layer has been deposited;
    patterning the amorphous carbon layer;
    etching at least a portion of the amorphous carbon layer;
    implanting a dopant into the amorphous carbon layer, wherein an implant energy utilized to energize the dopant is between about 0.5 keV and about 20 keV; and
    repeating the etching at least a portion of the amorphous carbon layer and the implanting a dopant into the amorphous carbon layer consecutively until the underlayer is exposed.

8. The method of claim 7, further comprising etching the underlayer.

9. The method of claim 8, wherein the underlayer comprises a single layer or a dielectric stack.

10. The method of claim 7, wherein the dopant is selected from the group consisting of boron, carbon, silicon, nitrogen, phosphorous, arsenic, aluminum, and tungsten.

* * * * *